(12) United States Patent
Nammi et al.

(10) Patent No.: US 11,057,794 B2
(45) Date of Patent: *Jul. 6, 2021

(54) REDUNDANCY VERSION INDICATION IN FIFTH GENERATION (5G) OR OTHER NEXT GENERATION COMMUNICATION SYSTEMS

(71) Applicant: AT&T INTELLECTUAL PROPERTY I, L.P., Atlanta, GA (US)

(72) Inventors: SaiRamesh Nammi, Kista (SE); Ralf Bendlin, Cedar Park, TX (US); Arunabha Ghosh, Austin, TX (US)

(73) Assignee: AT&T INTELLECTUAL PROPERTY I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/732,416

(22) Filed: Jan. 2, 2020

(65) Prior Publication Data

US 2020/0137627 A1 Apr. 30, 2020

Related U.S. Application Data

(63) Continuation of application No. 15/932,240, filed on Feb. 16, 2018, now Pat. No. 10,536,879.

(51) Int. Cl.
*H04W 56/00* (2009.01)
*H04W 28/06* (2009.01)
(Continued)

(52) U.S. Cl.
CPC ....... *H04W 28/06* (2013.01); *H03M 13/6306* (2013.01); *H04L 1/0013* (2013.01);
(Continued)

(58) Field of Classification Search
CPC . H04W 28/06; H04W 28/04; H04M 13/6306; H04L 1/0013; H04L 1/0023;
(Continued)

(56) References Cited

U.S. PATENT DOCUMENTS

| 7,426,201 B2 | 9/2008 | Kim et al. |
| 8,363,624 B2 | 1/2013 | Blanz et al. |

(Continued)

FOREIGN PATENT DOCUMENTS

| AU | 2013200180 B2 | 7/2015 |
| WO | 2017/091244 A1 | 6/2017 |

(Continued)

OTHER PUBLICATIONS

Non-Final Office Action received for U.S. Appl. No. 15/932,240 dated Mar. 6, 2019, 34 pages.

(Continued)

*Primary Examiner* — Sai Ming Chan

(74) *Attorney, Agent, or Firm* — Amin, Turocy & Watson, LLP

(57) ABSTRACT

An adaptive downlink control channel structure is utilized for control channel transmission for 5G and other next generation wireless systems. Moreover, the adaptive downlink control channel structure can utilize a reduced length/size to decrease signaling overhead for each transport block. In an aspect, a first downlink control channel structure for a data transmission can be utilized to implicitly indicate redundancy version (RV) and a second downlink control channel structure for a subsequent data transmission can be utilized to explicitly indicate the RV. In another aspect, the RV can be indicative via an adaptive bit load. Further, in yet another aspect, the RV can be indicated based on a joint encoding of RV and new data indicator (NDI) information.

20 Claims, 15 Drawing Sheets

(51) Int. Cl.
*H04L 1/00* (2006.01)
*H04L 1/18* (2006.01)
*H04W 28/04* (2009.01)
*H03M 13/00* (2006.01)

(52) U.S. Cl.
CPC .......... *H04L 1/0023* (2013.01); *H04L 1/0072* (2013.01); *H04L 1/1812* (2013.01); *H04W 28/04* (2013.01); *H04L 1/0057* (2013.01); *H04L 1/18* (2013.01)

(58) Field of Classification Search
CPC ... H04L 1/0072; H04L 1/1812; H04L 1/0057; H04L 1/18
USPC ......................................................... 370/216
See application file for complete search history.

(56) References Cited

U.S. PATENT DOCUMENTS

| | | | |
|---|---|---|---|
| 9,071,402 B2* | 6/2015 | Cheng | H04L 1/1893 |
| 2007/0259665 A1 | 11/2007 | Chiu et al. | |
| 2009/0276675 A1 | 11/2009 | Ojala et al. | |
| 2016/0128032 A1* | 5/2016 | Wang | H04L 1/1819 |
| | | | 370/329 |
| 2016/0270038 A1 | 9/2016 | Papasakellariou | |
| 2017/0251517 A1* | 8/2017 | Kimura | H04W 72/0453 |
| 2017/0286410 A1 | 10/2017 | Xu et al. | |
| 2017/0289979 A1 | 10/2017 | Xu et al. | |
| 2017/0310431 A1 | 10/2017 | Iyer et al. | |
| 2017/0332359 A1 | 11/2017 | Tsai et al. | |
| 2017/0359148 A1 | 12/2017 | Richardson et al. | |
| 2017/0367110 A1 | 12/2017 | Li et al. | |
| 2018/0014298 A1 | 1/2018 | Sun et al. | |

FOREIGN PATENT DOCUMENTS

| | | | |
|---|---|---|---|
| WO | 2017/101972 | A1 | 6/2017 |
| WO | 2017/107904 | A1 | 6/2017 |
| WO | 2017/131810 | A1 | 8/2017 |
| WO | 2017/161583 | A1 | 9/2017 |
| WO | 2018/026241 | A1 | 2/2018 |

OTHER PUBLICATIONS

Cheng, et al., "Adaptive incremental redundancy [WCDMA systems]." Vehicular Technology Conference, 2003, VTC 2003-Fall, 2003 IEEE 58th, vol. 2, IEEE, pp. 737-741 (2003).

Chen, et al. "Adaptive HARQ scheme for reliable multicast communications." Personal Indoor and Mobile Radio Communications {PIMRC},2012 IEEE 23rd International Symposium, IEEE, pp. 239-242 (2012).

International Search Report and Written Opinion received for PCT Application Serial No. PCT/US2019/017303 dated Jun. 3, 2019, 24 pages.

AT&T, "On Potential Enhancements to PDCCH for URLLC", URL : http://www.3gpp.org/ftp/Meetings%5F3GPP%5FSVNC/RAN1/Docs/R1%2DI988437%2Ezip, 3GPP TSG RAN WG1 Ad-Hoc Meeting 1901 Taipei, Taiwan, Jan. 21-25, 2019, R1-1900437, Jan. 20, 2019, pp. 1-7.

Motorola, "PDCCH Scheduling Assignment Field Definition (MCS, RV, NDI)", 3GPP TSG RAN #51bis Sevila Spain Jan. 14-18, 2009, R1-080436, Jan. 19, 2008, pp. 1-6.

"LTE: Evolved Universal Terrestrial Radio Access (E-UTRA); Multiplexing and channel coding (3GPP TS 36.212 version 14.5.1 Release 14)", URL : http://www.etsi.org/deliver/etsi ts/136288 136212/14.85.81 68/ts 136212vl4858lp.pdf, ETSI Technical Specification, European Telecommunications Standards Institute, Jan. 25, 2018, 208 pages.

"LTE; Evolved Universal Terrestrial Radio Access (E-UTRA); Physical layer procedures (3GPP TS 36.213 version 14.5.8 Release 14)", URL : http://www.etsi.org/deliver/etsi ts/136288 136299/136213/14.85.88 68/ts 136213vl48580p.pdf, ETSI Technical Specification, European Telecommunications Standards Institute, Jan. 26, 2018, 464 pages.

Nokia: "Implicit Redundancy Version for IR HARQ Scheme", URL: http://www.3gpp.org/ftp/tsg ran/WG1 RL 1/TSGRI AH/Rel-6 AH 0406/Docs/ZIPs/, 3GPP Draft TSG-RAN WG1 Rel-6 Ad Hoc Cannes, France Jun. 21-24, 2004, R1-040752, Jun. 18, 2004, 3 Pages.

Mediatek: "Multi-TTI scheduling", URL:http://www.3gpp.org/ftp/tsg ran/WGI_RL1/TSGRI 84b/Docs/, GPP TSG Ran Wg1 Meeting# 84bis Busan, Korea, Apr. 11-15, 2016 Agenda item 7.3.11, 3GPP Draft; R1-163830, Apr. 18, 2016, 4 pages.

U.S. Appl. No. 15/932,240, filed Feb. 16, 2018.

* cited by examiner

500

502: DCI WITHOUT RV FOR EACH TB, FLAG =0 (IMPLICITLY INDICATING RV=0)

504: DCI WITH RV (2BITS) FOR EACH TB, FLAG=1 (EXPLICITLY INDICATING RV)

FIG. 5

DCI WITH JOINTLY ENCODED FIELDS FOR RV AND NDI

FIG. 6

REDUNDANCY VERSION INDICATION IN FIFTH GENERATION (5G) OR OTHER NEXT GENERATION COMMUNICATION SYSTEMS

RELATED APPLICATION

The subject patent application is a continuation of, and claims priority to, U.S. patent application Ser. No. 15/932,240 (now U.S. Pat. No. 10,536,879), filed Feb. 16, 2018, and entitled "REDUNDANCY VERSION INDICATION IN FIFTH GENERATION (5G) OR OTHER NEXT GENERATION COMMUNICATION SYSTEMS," the entirety of which application is hereby incorporated by reference herein.

TECHNICAL FIELD

The subject disclosure relates to wireless communications, e.g., redundancy version indication in fifth generation (5G) or other next generation communication systems.

BACKGROUND

Data communication is prone to errors due to various factors such as, traffic congestion, delay, packet drop, non-receipt of acknowledgements, signaling factors, etc. In one example, forward error correction (FEC) is utilized to prevent these errors. When forward error correction is applied to an information block, additional parity bits, that are added to the information bits, are utilized to protect the information bits when passed through a communication channel. Based on the performance in additive white Gaussian channels (AWGN), conventional third generation partnership project (3GPP) systems utilize low-density parity check (LDPC) codes as the channel coding scheme for encoding a data channel in downlink and uplink direction. The LDPC codes are a class of linear block codes, wherein the parity check matrix is sparse (e.g., having a low density). When iterative decoding is applied at the receiver, these codes are known to perform close to Shannon capacity with reduced decoding complexity. The accuracy of control channel reception can be improved by utilizing more parity bits for encoding the control channel payload. However, increasing the reliability by adding more parity bits can substantially increase a signaling overhead of the control channel and decrease the number resource elements utilized for data transmission. This in turn reduces the throughput and the capacity of the communication system.

To meet the huge demand for data centric applications, Third Generation Partnership Project (3GPP) systems and systems that employ one or more aspects of the specifications of the Fourth Generation (4G) standard for wireless communications will be extended to a Fifth Generation (5G) standard for wireless communications. Unique challenges exist to provide levels of service associated with forthcoming 5G, or other next generation, standards for wireless communication.

BRIEF DESCRIPTION OF THE DRAWINGS

FIG. 5 illustrates example payload structures in accordance with the subject embodiments.

FIG. 6 illustrates an example DCI structure that utilizes a joint encoding of redundancy version (RV) and new data indicator (NDI) fields in accordance with the subject embodiments.

DETAILED DESCRIPTION

Figure 1:
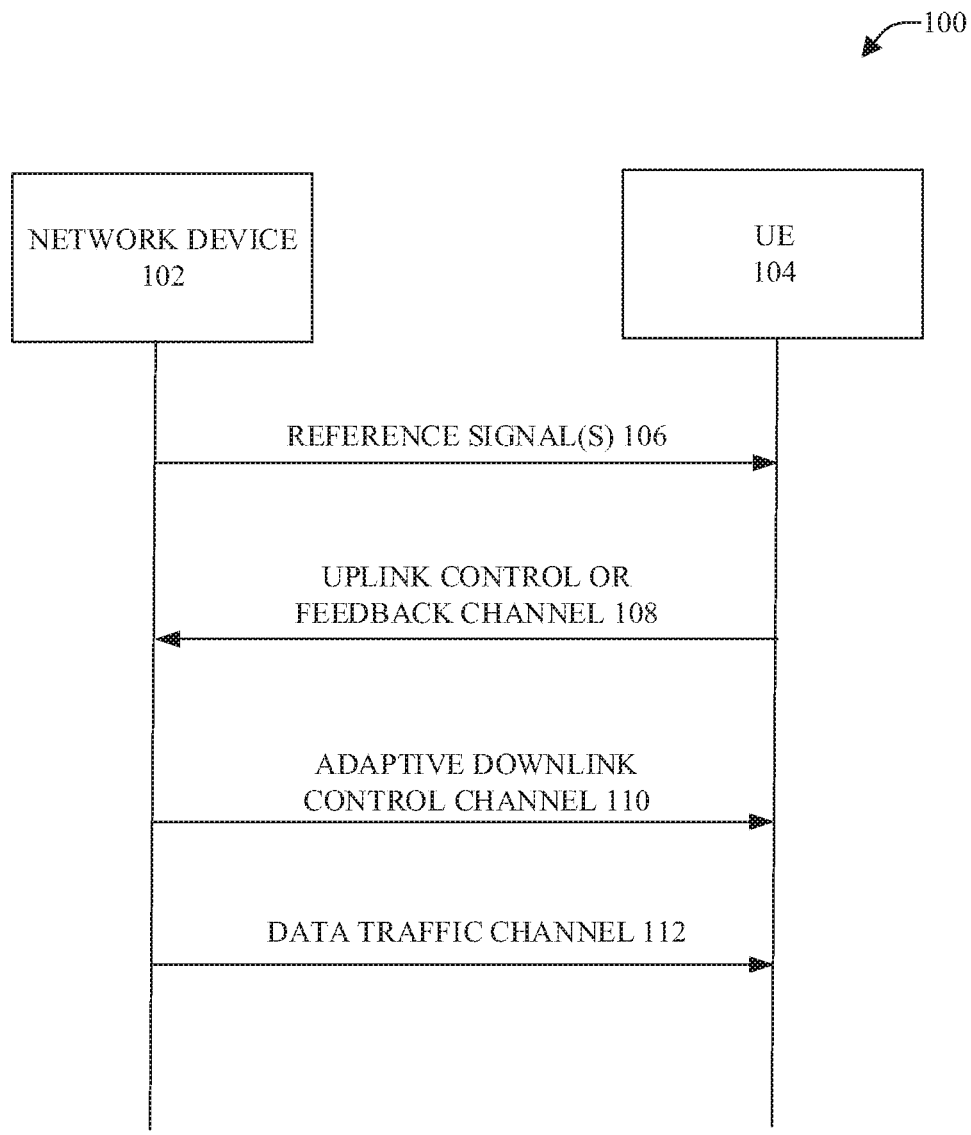
FIG. 1 illustrates an example is an example message sequence flow chart that can facilitate downlink data transfer.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

As used in this application, the terms "component," "module," "system," "interface," "node," "platform," "server," "controller," "entity," "element," "gateway," or the like are generally intended to refer to a computer-related entity, either hardware, a combination of hardware and software, software, or software in execution or an entity related to an operational machine with one or more specific functionalities. For example, a component may be, but is not limited to being, a process running on a processor, a processor, an object, an executable, a thread of execution, computer-executable instruction(s), a program, and/or a computer. By way of illustration, both an application running on a controller and the controller can be a component. One or more components may reside within a process and/or thread of execution and a component may be localized on one computer and/or distributed between two or more computers. As another example, an interface can comprise input/output (I/O) components as well as associated processor, application, and/or API components.

Further, the various embodiments can be implemented as a method, apparatus, or article of manufacture using standard programming and/or engineering techniques to produce software, firmware, hardware, or any combination thereof to control a computer to implement one or more aspects of the disclosed subject matter. An article of manufacture can encompass a computer program accessible from any computer-readable device or computer-readable storage/communications media. For example, computer readable storage media can comprise but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications can be made to this configuration without departing from the scope or spirit of the various embodiments.

In addition, the word "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms like "user equipment," "communication device," "mobile device," "mobile station," and similar terminology, refer to a wired or wireless communication-capable device utilized by a subscriber or user of a wired or wireless communication service to receive or convey data, control, voice, video, sound, gaming, or substantially any data-stream or signaling-stream. The foregoing terms are utilized interchangeably in the subject specification and related drawings. Data and signaling streams can be packetized or frame-based flows. Further, the terms "user," "subscriber," "consumer," "customer," and the like are employed interchangeably throughout the subject specification, unless context warrants particular distinction(s) among the terms. It should be noted that such terms can refer to human entities or automated components supported through artificial intelligence (e.g., a capacity to make inference based on complex mathematical formalisms), which can provide simulated vision, sound recognition and so forth.

The systems and methods disclosed herein relate to communication systems that can indicate redundancy version in using an adaptive control channel structure (e.g., uplink control channel and/or downlink control channel). Typically, a transport block is divided into smaller size code blocks, referred to as code block segmentation, before being encoded by a parity check code. In one aspect, the parity check code is a systematic code, such as but not limited to a low-density parity check (LDPC) code. The parity check code adds parity bits to protect the information bits. The accuracy of control channel reception (e.g., by a receiver, for example a user equipment (UE)) can be increased by utilizing more parity bits for encoding the control channel payload. However, increasing the reliability by adding more parity bits can substantially increase a signaling overhead of the control channel and decrease the number resource elements utilized for data transmission. This in turn reduces the throughput and the capacity of the communication system. The systems and methods disclosed herein reduce the signaling overhead of the control channels by reducing the number of bits utilized to transmit a redundancy version (RV).

It should be noted that although various aspects and embodiments have been described herein in the context of 5G, universal mobile telecommunications system (UMTS), and/or long term evolution (LTE), or other next generation networks, the disclosed aspects are not limited to 5G, a UMTS implementation, and/or an LTE implementation as the techniques can also be applied in 3G, 4G, or LTE systems. For example, aspects or features of the disclosed embodiments can be exploited in substantially any wireless communication technology. Such wireless communication technologies can include UMTS, code division multiple access (CDMA), Wi-Fi, worldwide interoperability for microwave access (WiMAX), general packet radio service (GPRS), enhanced GPRS, third generation partnership project (3GPP), LTE, third generation partnership project 2 (3GPP2) ultra mobile broadband (UMB), high speed packet access (HSPA), evolved high speed packet access (HSPA+), high-speed downlink packet access (HSDPA), high-speed uplink packet access (HSUPA), Zigbee, or another IEEE 802.XX technology. Additionally, substantially all aspects disclosed herein can be exploited in legacy telecommunication technologies.

As used herein, "5G" can also be referred to as New Radio (NR) access. Accordingly, systems, methods, and/or machine-readable storage media for facilitating improved communication coverage for 5G systems are desired. As used herein, one or more aspects of a 5G network can comprise, but is not limited to, data rates of several tens of megabits per second (Mbps) supported for tens of thousands of users; at least one gigabit per second (Gbps) offered simultaneously to tens of users (e.g., tens of workers on the same office floor); several hundreds of thousands of simultaneous connections supported for massive sensor deployments; spectral efficiency significantly enhanced compared to 4G; improvement in coverage relative to 4G; signaling efficiency enhanced compared to 4G; and/or latency significantly reduced compared to LTE.

Referring initially to FIG. 1, there illustrated is an example message sequence flow chart 100 that can facilitate downlink data transfer, according to one or more aspects of the disclosed subject matter. As illustrated, the non-limiting message sequence flow chart 100 represents a message sequence between a network device 102 and a user equipment (UE) 104. In one example, the network device 102 can comprise most any radio access network (RAN) device, for example, a network controller, an access point (e.g., eNodeB, gNodeB, etc.) or any number of other network components of a communication network (e.g., cellular network). In another example, the UE 104 can comprise, but are is limited to most any industrial automation device and/or consumer electronic device, for example, a tablet computer, a digital media player, a wearable device, a digital camera, a media player, a cellular phone, a personal computer, a personal digital assistant (PDA), a smart phone, a laptop, a gaming system, set top boxes, home security systems, an Internet of things (IoT) device, a connected vehicle, at least partially automated vehicle (e.g., drones), etc.

During downlink data transfer, one or more pilot signals and/or reference signals 106 can be transmitted from the network device 102 to the UE 104. As an example, the one or more pilot signals and/or reference signals 106 can be beamformed or non-beamformed. According to some implementations, the one or more pilot signals and/or reference signals 106 can be cell (e.g., network device) specific and/or mobile device specific. In an aspect, the downlink reference signals 106 can comprise predefined signals occupying specific resource elements within the downlink time-frequency grid. There are several types of downlink reference signals 106 that are transmitted in different ways and used for different purposes by the receiving terminal. For example, the downlink reference signals 106 can comprise CSI reference signals (CSI-RS) that are specifically intended to be used by terminals to acquire channel-state information (CSI) and beam specific information (beam RSRP). In 5G networks, CSI-RS is UE specific so it can have a significantly lower time/frequency density. Additionally or alternatively, the downlink reference signals 106 can comprise demodulation reference signals (DM-RS) and/or UE-specific reference signals that are specifically intended to be used by terminals for channel estimation for data channel. The term "UE-specific" relates to the fact that each demodulation reference signal is intended for channel estimation by a single terminal. That specific reference signal is then only transmitted within the resource blocks assigned for data traffic channel transmission to that particular terminal. Further, the downlink reference signals 106 can comprise other reference signals, for example, phase tracking and tracking and sounding reference signals.

Based on the one or more pilot signals and/or reference signals 106, the UE 104 can compute the channel estimates and can determine (e.g., can compute) the one or more parameters needed for channel state information (CSI) reporting, as indicated at 108. The CSI report can comprise, for example, a channel quality indicator (CQI), a precoding matrix index (PMI), rank information (RI), the best subband indices, best beam indices, and so on, or any number of other types of information.

The CSI report can be sent from the UE 104 to the network device 102 via a feedback channel (e.g., uplink control or feedback channel 108). The CSI report can be sent on a periodic basis or on-demand (e.g., aperiodic CSI reporting). The network device 102, which can comprise a scheduler, can use the CSI report for choosing the parameters for scheduling of the UE 104. As an example, the parameters can comprise, but are not limited to, transmission power, modulation coding scheme (MCS), primary resource blocks (PRBs), etc. In one aspect, the network device 102 can send the scheduling parameters to the UE 104 in a downlink control channel (e.g., adaptive downlink control channel 110), referred to as the Physical Downlink Control Channel (PDCCH). The PDCCH carries information about the scheduling grants, such as but not limited to, number of multiple input, multiple output (MIMO) layers scheduled, transport block sizes, modulation for each codeword, parameters related to hybrid automatic repeat request (HARQ), sub band locations and/or precoding matrix index corresponding to that sub bands. In one aspect, the PDCCH employs a defined format (e.g., downlink control information (DCI) format) to transmit the following information: Localized/Distributed virtual resource block (VRB) assignment flag; Resource block assignment; Modulation and coding scheme for each transport block (TB); HARQ process number; New data indicator for each TB; Redundancy version (RV) for each TB; Transmit Power Control (TPC) command for uplink control channel; Downlink assignment index; Precoding matrix index; Number of layers; etc.

Conventional systems utilize two bits per TB for transmission of the RV within the PDCCH. In contrast, the network device 102 can reduce the number of bits utilized for RV indication, for example, by employing an adaptive structure for the downlink control channel 110. Since a systematic code, for example LDPC, is utilized during encoding the code blocks, RV0 is typically utilized for first transmissions (e.g. not a retransmission). Accordingly, in one example, for first transmissions the RV can be indicated implicitly (e.g., by only explicitly indicating that the transmission is a first transmission) and for subsequent transmissions (e.g., retransmission) the RV can be indicated explicitly (e.g., by employing dedicated bits to define the RV). In another example, the RV can be indicated by employing an adaptive bit load. In yet another example, the RV can be indicated by employing joint encoding of the RV and the New data indicator (NDI). Since the size of the downlink control channel 110 is reduced, the power utilized for transmitting the downlink control channel 110 can be decreased and utilized for data transmission. With improved data transmission power, the link and system throughput can be significantly improved.

After the scheduling parameter information has been transmitted, the actual data transfer can take place from the network device 102 to the UE 104 over the data traffic channel 112. In NR, for data transfer, code block segmentation can be applied prior to encoding the transport block (e.g., communication data that is to be transferred). Code block segmentation refers to a process of dividing the transport block into smaller code blocks, the sizes of which should correspond to a code block size supported by the encoder. When the code blocks are received by the UE 104, the UE 104 can utilize error correction techniques (e.g., forward error correction (FEC)) to determine if any errors have occurred during transmission. If such errors are not detected and the code blocks have been decoded correctly, the UE 104 can provide an acknowledge (ACK) message to the network device 102. Alternatively, if one or more of the code blocks have errors, the UE 104 can provide a negative acknowledgement (NAK) message.

Further, in NR, rate-matching is utilized to extract an exact set of bits to be transmitted within a given Transmission Time Interval (TTI). As an example, the rate-matching for turbo coded transport channels is defined for each code block and there are three main steps composing a rate-matching, for example, sub-block interleaver, bit collection, and bit selection. Finally, after the rate-matching, each individually processed code block is to be concatenated and transferred to a modulation block (e.g., a mapper). The sub-block interleaver is defined for each output stream from turbo coding. The streams include a systematic bit stream, a parity bit stream and an interleaved parity stream. The bit collection step concatenates the three-bit streams (the systematic bit stream, parity bit stream and interleaved parity stream) together. The bit selection extracts consecutive bits from the circular buffer to the extent that fits into the assigned physical resource. Combined with the turbo coding, the circular buffer can puncture or repeat the collected coded bits to achieve an alterable channel coding rate under different scenarios.

To enable the operation of Incremental Redundancy (IR) based HARQ, the rate-matching can provide different subsets of the code block for different transmissions of a packet. The RV provides information regarding starting points of bit selection, for example, within a circular buffer. In the case of the first transmission of each coded block (RV=0), puncturing a small amount of systematic bits. Namely, instead of reading out data from the beginning of systematic bit stream, the output of the circular buffer starts from a specified point. In the case of HARQ retransmission, the starting point of extracting bits will be configured according to a specified RV (RV=RV1, RV2, or RV3).

Although the disclosure has been described with respect to a downlink control channel structure, it is noted that the disclosure is not so limited and that the aspects described herein can be applied to uplink and/or side link data transmission schemes. In addition, the embodiments disclosed herein are applicable to single carrier, multi carrier, and/or carrier aggregation (e.g., wherein the UE can receive and/or transmit data to more than one serving cells using MIMO) transmission schemes. It is noted that the term carrier aggregation is also referred to (e.g. interchangeably called) "multi-carrier system", "multi-cell operation", "multi-carrier operation", "multi-carrier" transmission and/or reception.

Figure 2:
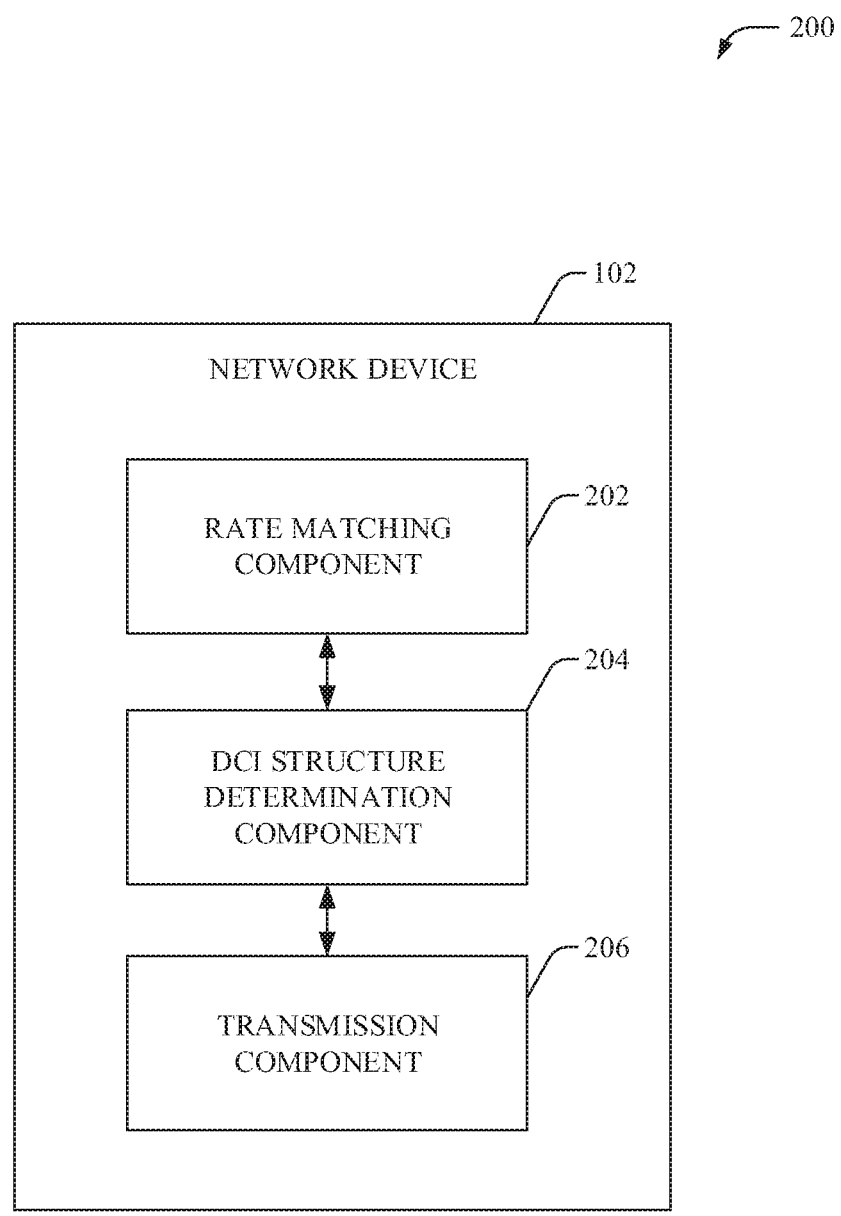
FIG. 2 illustrates an example system that transmits a control signal that adheres to an adaptive downlink control channel structure.

Referring now to FIG. 2, there illustrated is an example system 200 that transmits a control signal that adheres to an adaptive downlink control channel structure, in accordance with an aspect of the subject disclosure. It is noted that the network device 102 can comprise functionality as more fully described herein, for example, as described above with regard to system 100. The various aspects discussed herein can facilitate improved coverage in a wireless communications system. Although system 200 has been described with respect to a 5G network, it is noted that the subject disclosure is not limited to 5G networks and can be utilized in most any communication network.

During data transmission, the network device 102 can utilize a systematic code, for example, LDPC code to add parity bits for error correction. In one example, during a first step of the physical-layer processing, a 24-bit cyclic redundancy check (CRC) is calculated for and appended to each TB. The CRC allows for receiver-side detection of errors in the decoded transport block. The corresponding error indication can, for example, be used by the downlink hybrid-ARQ protocol as a trigger for requesting retransmissions. If the transport block, including the transport-block CRC, exceeds the maximum code-block size (e.g., 8448 for base graph 2 and 3840 for Base graph 2), code-block segmentation is applied before the LDPC coding. During code-block segmentation, the TB is segmented into smaller code blocks, the sizes of which match the set of code-block sizes supported by a LDPC coder.

In the case of a single code block when no segmentation is needed, no additional code-block CRC is applied. Typically, code-block segmentation is applied to large transport blocks for which the relative extra overhead due to the additional transport block CRC is small. Information about the TB size is provided to the UE as part of the scheduling assignment transmitted on the PDCCH control channel. Based on this information, the UE can determine the code-block size and number of code blocks. The UE receiver can thus, based on the information provided in the scheduling assignment, straightforwardly undo or assemble the code-block segmentation and recover the decoded transport blocks.

Referring back to FIG. 2, a rate matching component 202 is utilized for rate matching the transmission, after the information bits are segmented and encoded using LDPC code (either base graph 1 or 2). In one aspect, the rate matching component 202 can utilize a circular buffer (e.g., with four redundancy versions) for rate matching each code block. The starting positions of each RV is shown in Table 1.

TABLE 1

| $rv_{id}$ | $k_0$ | |
|---|---|---|
| | Base graph 1 | Base graph 2 |
| 0 | 0 | 0 |
| 1 | $\lfloor \frac{17N_{cb}}{66Z_c} \rfloor Z_c$ | $\lfloor \frac{13N_{cb}}{50Z_c} \rfloor Z_c$ |
| 2 | $\lfloor \frac{33N_{cb}}{66Z_c} \rfloor Z_c$ | $\lfloor \frac{25N_{cb}}{50Z_c} \rfloor Z_c$ |
| 3 | $\lfloor \frac{56N_{cb}}{66Z_c} \rfloor Z_c$ | $\lfloor \frac{43N_{cb}}{50Z_c} \rfloor Z_c$ |

For each transmission, the network device 102 can inform the UE which RV it is currently scheduling. The RV is communicated via the downlink control channel for Physical Downlink Shared Channel (PDSCH) transmission and downlink control channel (grant channel) for uplink data transmission. As an example, The RV specifies which set of error detecting (ED), FEC, and/or data bits are being transmitted. as another example, the RV conveys to the UE information regarding an amount of redundancy added into the code block while turbo encoding.

The DCI structure determination component 204 can be utilized to determine a variable-length (e.g., comprising a reduced number of bits) structure and/or format for the downlink control channel. In one aspect, a first DCI structure utilized for a first (or initial) transmission of a TB can be different from a second DCI structure utilized for a retransmission of the TB. For example, the first DCI structure can exclude bits utilized to indicate RV (implicitly indicating RV=RV0) and the second DCI structure can include bits (e.g., two bits for each TB) to specify RV (e.g., explicitly indicate RV=RV0, RV1, RV2, or RV3). In another aspect, the DCI structure determination component 204 can generate a DCI structure that includes a newly-defined single bit (e.g., a bit/flag dedicated for RV indication) that can be utilized to indicate whether additional bits indicative of RV will be present within the structure. For example, the newly-defined single bit is set to 0 for RV=RV0 and if set to 1, then additional bits (e.g., two additional bits) are used for each TB to indicate the RV (RV=RV1, RV2, or RV3) for the transmission. In yet another aspect, the DCI structure determination component 204 can generate a DCI structure that comprises a jointly encoded field for RV and NDI instead of using separate fields. Accordingly, the adaptable DCI structures determined via DCI structure determination component 204 can comprise fewer bits than the number of bits utilized by conventional DCI structures to convey RV. Typically, the NDI bit informs the UE whether the data is new or a retransmission. If NDI bit is toggled i.e. different from the one sent in previous transmission, then, it means new data is transmitted in downlink for the given HARQ process.

According to an embodiment, a transmission component 206 can be utilized to transmit the downlink control channel adhering to the adaptable DCI structure specified via DCI structure determination component 204. Since the number of bits utilized to indicate RV is reduced, the power utilized for transmitting downlink control channel is reduced and can be utilized for data transmission. Hence, with improved data transmission power, the link and system throughput are significantly improved. MIMO systems can significantly increase the data carrying capacity of wireless systems. For these reasons, MIMO is an integral part of the 3rd and 4th generation wireless systems. 5G systems can also employ MIMO systems also called massive MIMO systems (hundreds of antennas at the Transmitter side and/Receiver side). Typically, with a (Nt, Nr), where Nt denotes the number of transmit antennas and Nr denotes the receive antennas, the peak data rate multiplies with a factor of Nt over single antenna systems in rich scattering environment.

In some embodiments, the network device 102 can comprise a radio network node that can comprise any type of network node that serves one or more UEs and/or that is coupled to other network nodes or network elements or any radio node from where the one or more UEs receive a signal. Examples of radio network nodes are Node B, base station (BS), multi-standard radio (MSR) node such as MSR BS, eNodeB, gNodeB, network controller, radio network controller (RNC), base station controller (BSC), relay, donor node controlling relay, base transceiver station (BTS), access point (AP), transmission points, transmission nodes, RRU, RRH, nodes in distributed antenna system (DAS) etc.

Cloud radio access networks (RAN) can enable the implementation of concepts such as software-defined network (SDN) and network function virtualization (NFV) in 5G networks. This disclosure can facilitate a generic channel state information framework design for a 5G network. Certain embodiments of this disclosure can comprise an SDN controller that can control routing of traffic within the network and between the network and traffic destinations. The SDN controller can be merged with the 5G network architecture to enable service deliveries via open application programming interfaces (APIs) and move the network core towards an all Internet protocol (IP), cloud based, and software driven telecommunications network. The SDN controller can work with, or take the place of Policy and Charging Rules Function (PCRF) network elements so that policies such as quality of service and traffic management and routing can be synchronized and managed end to end.

To meet the huge demand for data centric applications, 4G standards can be applied to 5G, also called NR access. 5G networks can comprise the following: data rates of several tens of megabits per second supported for tens of thousands of users; 1 gigabit per second can be offered simultaneously (or concurrently) to tens of workers on the same office floor; several hundreds of thousands of simultaneous (or concurrent) connections can be supported for massive sensor deployments; spectral efficiency can be enhanced compared to 4G; improved coverage; enhanced signaling efficiency; and reduced latency compared to LTE. In multicarrier system such as OFDM, each subcarrier can occupy bandwidth (e.g., subcarrier spacing). If the carriers use the same bandwidth spacing, then it can be considered a single numerology. However, if the carriers occupy different bandwidth and/or spacing, then it can be considered a multiple numerology.

Typically, the communication link-system performance is enhanced with the use of forward error correction (FEC) code. When FEC is applied to the transport block, additional parity bits are added to the information bits. These additional parity bits protect the information bits when passed through a communication channel. Based on the performance in additive white Gaussian channels (AWGN), low-density parity check (LDPC) codes can be utilized as the channel coding scheme for encoding data channel in downlink and/or uplink direction. However, it is noted that the specification is not limited to utilization of LDPC codes. LDPC codes are a class of linear block codes where the parity check matrix is sparse (low density of 1s). When iterative decoding is applied at the receiver, these codes are known to perform close to Shannon capacity with less decoding complexity. Although increasing the number of parity bits can provide improved control channel reception, the additional parity bits can significantly increase signaling overhead of the control channel and decrease the number resource elements available for data transmission. To decrease signaling overhead, while maintaining reliability, system 200 employs DCI data structures that are adaptable and/or utilize fewer bits to convey RV information to a UE. Although, the specification describes redundancy version indication in DCI for PDSCH, the aspects disclosed herein are not limited to PDSCH and can applicable for redundancy version indication in DCI for Physical Uplink Shared Channel (PUSCH) transmission.

Figure 3:
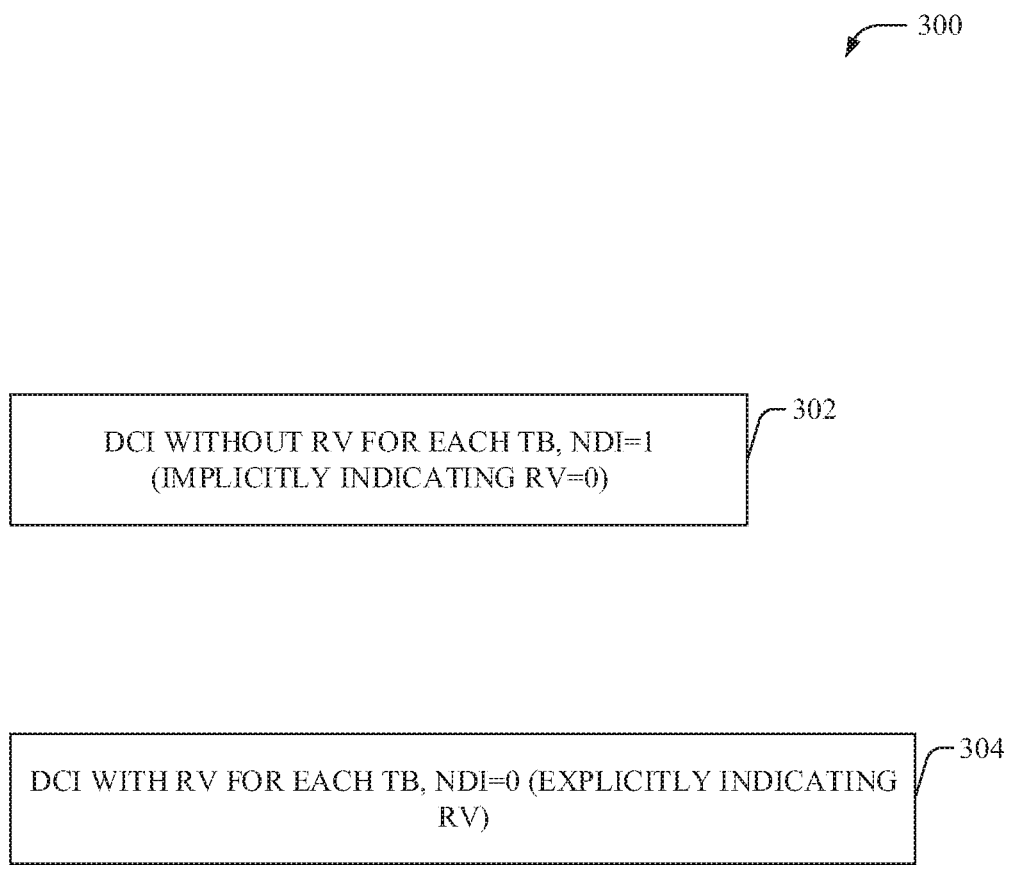
FIG. 3 illustrates example adaptive downlink control channel structures in accordance with an aspect of the subject disclosure.

Referring now to FIG. 3, there illustrated are example adaptive downlink control channel structures 300, in accordance with an aspect of the subject disclosure. It is noted that the adaptive downlink control channel structures 300 can be determined by the DCI structure determination component 204.

Typically, in 5G NR, the first transmission (e.g., not a retransmission) for PDSCH and/or PUSCH is scheduled with RV0. Further, a single bit, for example, a New Data Indicator (NDI), is utilized to indicate first transmissions for each TB. Accordingly, for the first transmission, without indicating RV explicitly, the NDI bit can be utilized to inform the UE that this is first transmission and RV0 is to be used for this transmission. Hence, the DCI structure 302 can be employed, wherein the NDI bit is set to 1 and the bits (e.g., two bits) for RV are excluded from the structure. For retransmission, the DCI structure 304 can be employed, wherein the NDI bit is set to 0 (e.g., to indicate a retransmission) and the bits (e.g., two bits) for RV are included within the structure.

Figure 4:
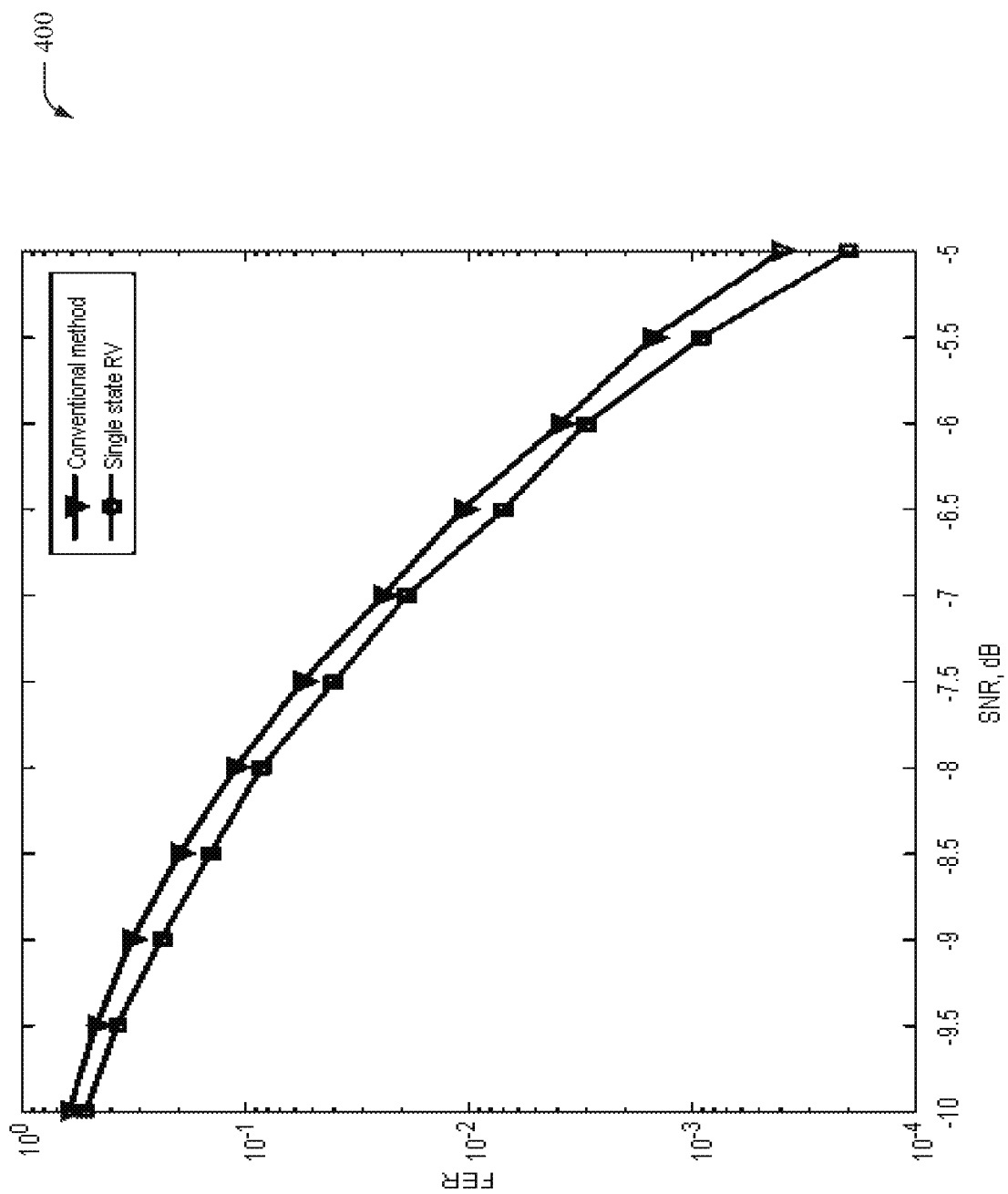
FIG. 4 illustrates an example graph that depicts the frame erasure rate (FER) for downlink control information (DCI) transmission utilizing different data structures.

Referring now to FIG. 4, there illustrated is an example graph 400 that depicts the frame erasure rate (FER) for DCI transmission using a conventional technique for first transmission and the FER for DCI transmission using the DCI structure 302 for first transmission. As shown, the FER while using the structure DCI 302 is less than that while using conventional techniques (that utilize a DCI structure comprising two dedicated bits for conveying RV for each TB) and thus, coverage can be improved by employing the structure DCI 302.

Referring now to FIG. 5, there illustrated are example payload structures 500, in accordance with an aspect of the subject disclosure. It is noted that the adaptive payload structures 500 can be determined by the DCI structure determination component 204.

In this example scenario, the network uses RV0 for every transmission i.e. HARQ-Chase combining (HARQ-CC), and thus, the network device (e.g., network device 102) can utilize a single bit to indicate this rather than using two bits to indicate RV. In one embodiment, a new bit is utilized to differentiate between HARQ-CC and HARQ-incremental Redundancy (IR). If that bit is set to 0 (HARQ-CC), the UE is to determine that RV0 is used for the current transmission. Alternatively, if that bit is set to 1 (HARQ-IR), then additional two bits are used for each TB to indicate the RV for the current transmission. Accordingly, when the UE detects that the bit is set to 1, it can then detect the additional two bits to determine the RV. Data structure 502 depicts HARQ- CC, wherein only one bit is utilized to indicate HARQ-CC and implicitly indicate that RV0 is utilized for the transmission. Further, data structure 504 depicts HARQ-IR, wherein three bits are used to indicate RV (e.g., one bit indicates HARQ-IR and two bits explicitly indicate the RV). In one embodiment, the differentiating bit is used for each TB e.g., individual differentiating bits. In another embodiment, only a single bit is used to differentiate between HARQ-CC and HARQ-IR for all TB. Although in the above example the bit is set to 1 to indicate HARQ-IR and set to 0 to indicate HARQ-CC, the subject specification is not so limited and alternatively, the bit can be set to 1 to indicate HARQ-CC and set to 0 to indicate HARQ-IR.

Referring now to FIG. 6, there illustrated is an example DCI structure 500 that utilizes a joint encoding of RV and NDI fields, in accordance with an aspect of the subject disclosure. It is noted that the DCI structure 600 can be determined by the DCI structure determination component 204.

In this example, the DCI structure 600 can comprise a common field for indicating RV and NDI for each TB. As an example, the common field comprises two bits that are encoded as shown in Table 2.

TABLE 2

| Joint Indication | RV | NDI |
| --- | --- | --- |
| 00 | 0 | 1 |
| 01 | RV1 | 0 |
| 10 | RV2 | 0 |
| 11 | RV3 | 0 |

The DCI structure 600 can be utilized for first transmissions and/or retransmissions. Since only two bits are utilized to convey RV and NDI information (instead of 3 bits), the signaling overhead can be reduced for each TB.

Figure 7:
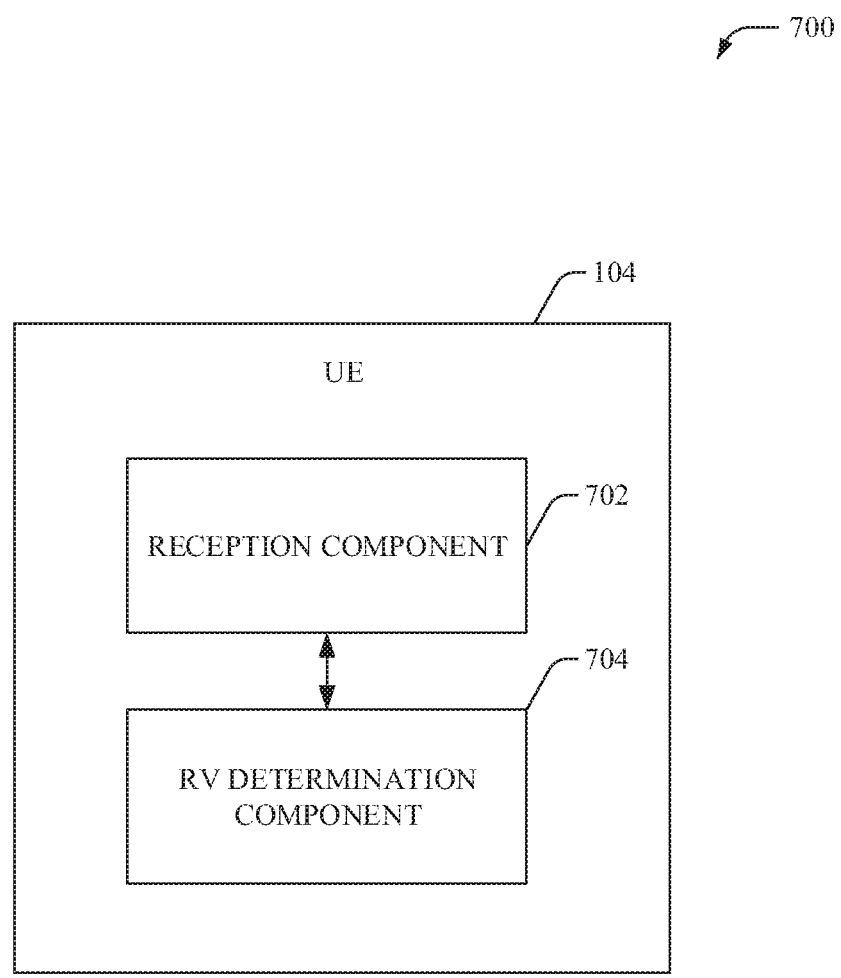
FIG. 7 illustrates an example system that receives a control signal that adheres to an adaptive downlink control channel structure.

Referring now to FIG. 7, there illustrated is an example system 700 that receives a control signal that adheres to an adaptive downlink control channel structure, according to an aspect of the subject disclosure. It is noted that the UE 104 can comprise functionality as more fully described herein, for example, as described above with regard to system 100. Although system 700 has been described with respect to a NR network, it is noted that the subject disclosure is not limited to NR networks and can be utilized in most any communication network.

In one aspect, during data communication a reception component 702 can receive, via a message that conforms to an adaptive DCI format, scheduling parameters related to a data transfer via a downlink control channel. Subsequent to the receiving of the scheduling parameters, the reception component 702 can receive data transfer of code blocks that have been generated during code block segmentation applied to a transport block. The UE 104 can decode the code blocks and provide ACK/NAK feedback (e.g., HARQ-ACK/NAK) to the network device based on errors determined during the decoding.

In one embodiment, when the received message indicates that NDI=1, a RV determination component 704 determines that the message does not comprise bits that provide RV indication and that RV0 is utilized for the transmission. Further, when the received message indicates that NDI=0, the RV determination component 704 determines that the message comprises bits that provide RV indication and determines the RV based on the bits.

In another embodiment, the received message can comprise a new bit that is reserved for differentiating between HARQ-CC and HARQ-IR. In this example embodiment, if the new bit is set to 0, the RV determination component 704 determines that the message does not comprise bits that provide RV indication and that RV0 is utilized for the transmission. Further, when the new bit is set to 1, the RV determination component 704 determines that the message comprises bits that provide RV indication and determines the RV based on the bits.

In yet another embodiment, the received message can comprise a field that uses joint encoding for RV and NDI for each TB. For example, the RV and NDI information is provided in 2 bits and is decoded by the RV determination component 704 using the information in Table 2.

FIGS. 8-11 illustrate flow diagrams and/or methods in accordance with the disclosed subject matter. For simplicity of explanation, the flow diagrams and/or methods are depicted and described as a series of acts. It is to be understood and noted that the various embodiments are not limited by the acts illustrated and/or by the order of acts, for example acts can occur in various orders and/or concurrently, and with other acts not presented and described herein. Furthermore, not all illustrated acts may be required to implement the flow diagrams and/or methods in accordance with the disclosed subject matter. In addition, those skilled in the art will understand and note that the methods could alternatively be represented as a series of interrelated states via a state diagram or events. Additionally, it should be further noted that the methods disclosed hereinafter and throughout this specification are capable of being stored on an article of manufacture to facilitate transporting and transferring such methods to computers. The term article of manufacture, as used herein, is intended to encompass a computer program accessible from any computer-readable device or computer-readable storage/communications media.

Figure 8:
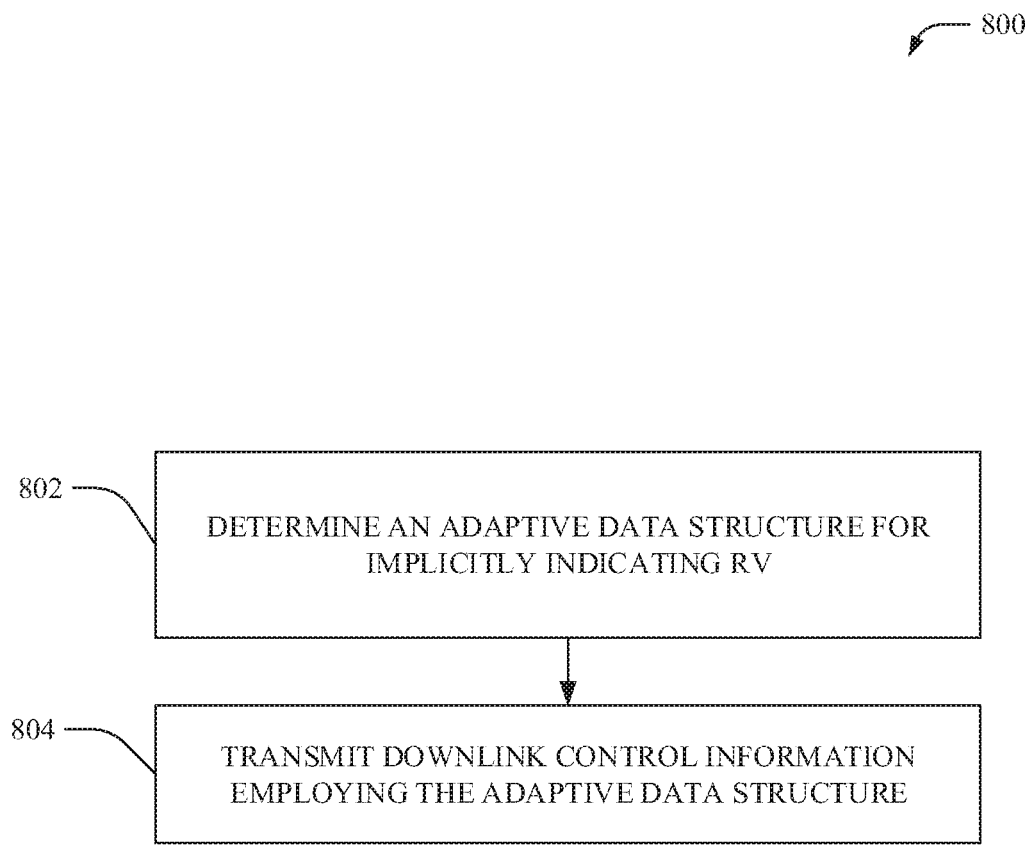
FIG. 8 illustrates an example method that facilitates a transmission of a control signal via an adaptive downlink control channel for RV indication.

Referring now to FIG. 8 there illustrated is an example method 800 that facilitates a transmission of a control signal via an adaptive downlink control channel for RV indication, according to an aspect of the subject disclosure. In an aspect, method 800 can be implemented by one or more network devices (e.g., network device 102) of a communication network (e.g., cellular network). At 802, an adaptive data structure (e.g., DCI format) can be determined for implicitly indicating RV. For example, the data structure does not comprise one or more dedicated bits for RV indication. Instead, RV0 can be indicated implicitly, for example, when the NDI bit is set to 1, or when a new bit for differentiating between HARQ-CC and HARQ-IR is set as 0 (indicating HARQ-CC).

At 804, downlink control channel information can be transmitted to a UE by employing the adaptive data structure. Based on the downlink control information, a data traffic channel can be established between the network device and the UE.

Figure 9:
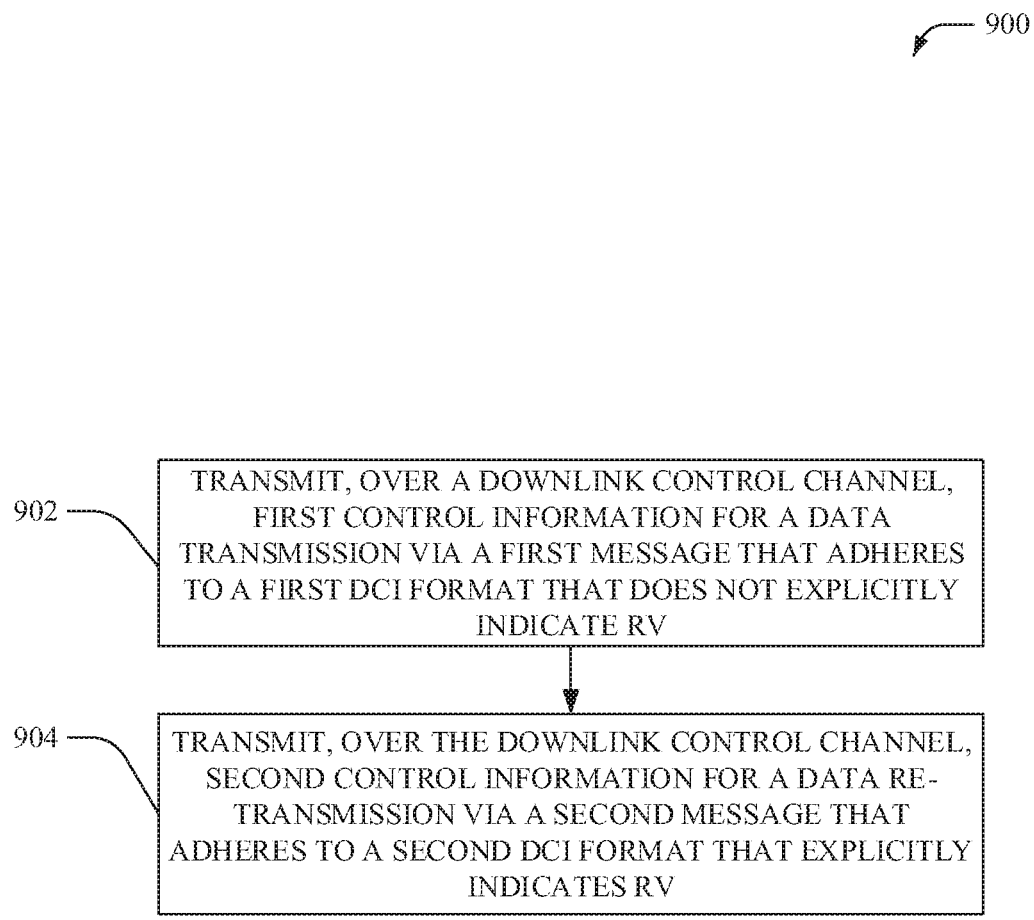
FIG. 9 illustrates an example method for indicating RV using an adaptive downlink control channel.

FIG. 9 illustrates an example method 900 for indicating RV using an adaptive downlink control channel, according to an aspect of the subject disclosure. As an example, method 900 can be implemented by one or more network devices (e.g., network device 102) of a communication network (e.g., cellular network). At 902, first control information (e.g., scheduling parameters) for a data transmission (a first and/or original data transmission) can be transmitted over a downlink control channel, via a first message that adheres to a first DCI format that does not explicitly indicate RV. As an example, the first DCI format does not comprise one or more bits reserved for explicit RV indication. Further, at 904, second control information (e.g., scheduling parameters) for a data retransmission can be transmitted over the downlink control channel, via a second message that adheres to a second DCI format that explicitly indicates RV. As an example, the second DCI format comprises one or more bits reserved for explicit RV indication. Moreover, the length of the second DCI format is greater than the length of the first DCI format, since the second DCI format comprises additional bits for explicit RV indication.

Figure 10:
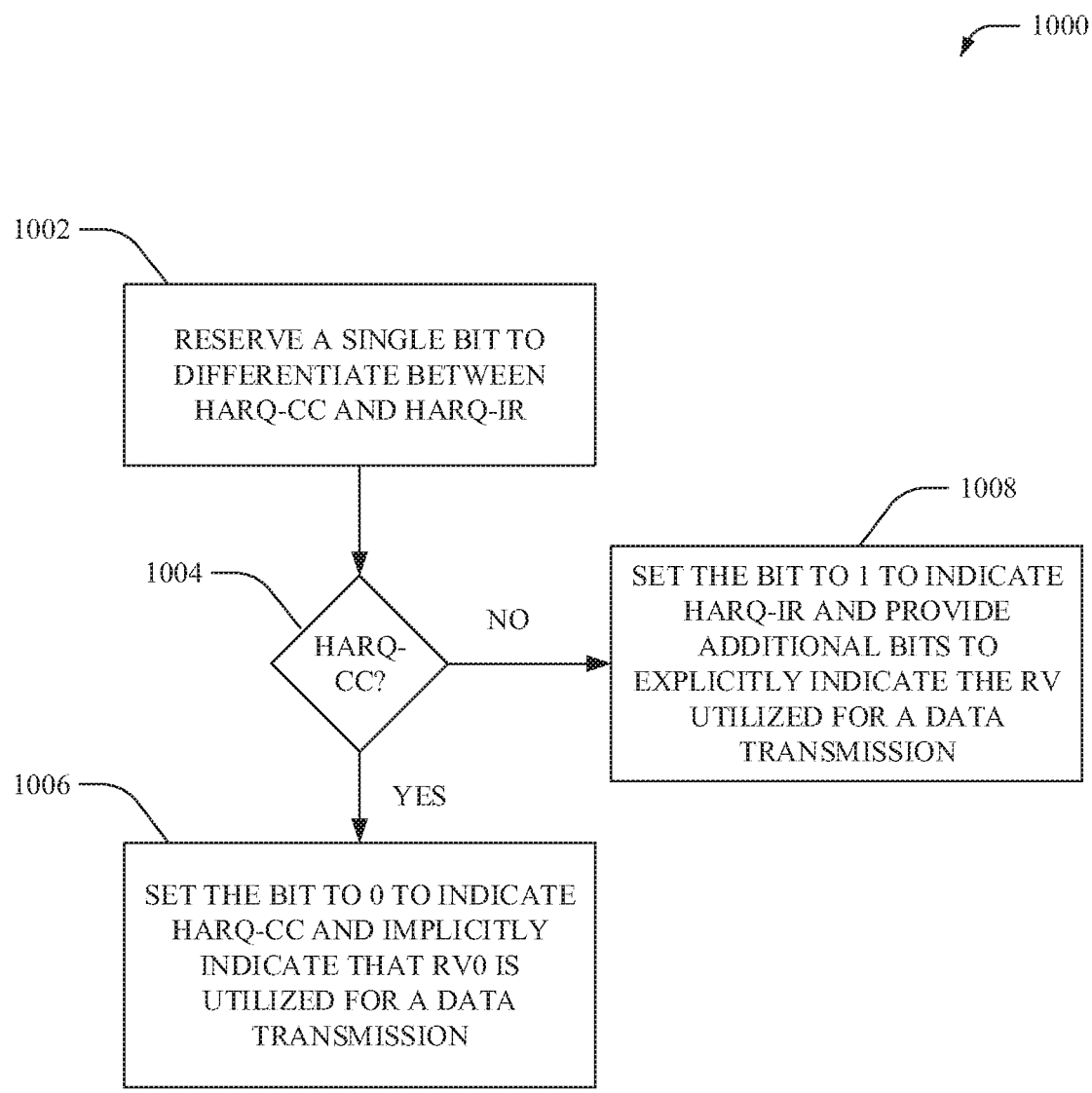
FIG. 10 illustrates an example method for indicating RV using an adaptive payload structure.

FIG. 10 illustrates an example method 1000 for indicating RV using an adaptive payload structure, according to an aspect of the subject disclosure. As an example, method 1000 can be implemented by one or more network devices (e.g., network device 102) of a communication network (e.g., cellular network). At 1002, a single bit (e.g., flag) can be reserved only for differentiating between HARQ-CC (e.g., bit=0) and HARQ-IR (e.g., bit=1). As an example, the new bit can be added as an additional bit to a DCI format. At 1004, it can be determined whether HARQ-CC is utilized. If determined that HARQ-CC is to be utilized, then at 1006, the bit can be set to 0 to indicate that HARQ-CC is being utilized and implicitly indicate that RV0 is utilized for a data transmission. Alternatively, if determined that HARQ-CC is not to be utilized, then at 1008, the bit can be set to 1 to indicate that HARQ-IR is being utilized and additional bits (e.g., two bits) can be provided within the DCI format to explicitly indicate the RV version (e.g., RV0, RV1, RV2, or RV3) utilized for the data transmission. In this example scenario, the length of the DCI format during HARQ-CC is shorter than that during HARQ-IR.

Figure 11:
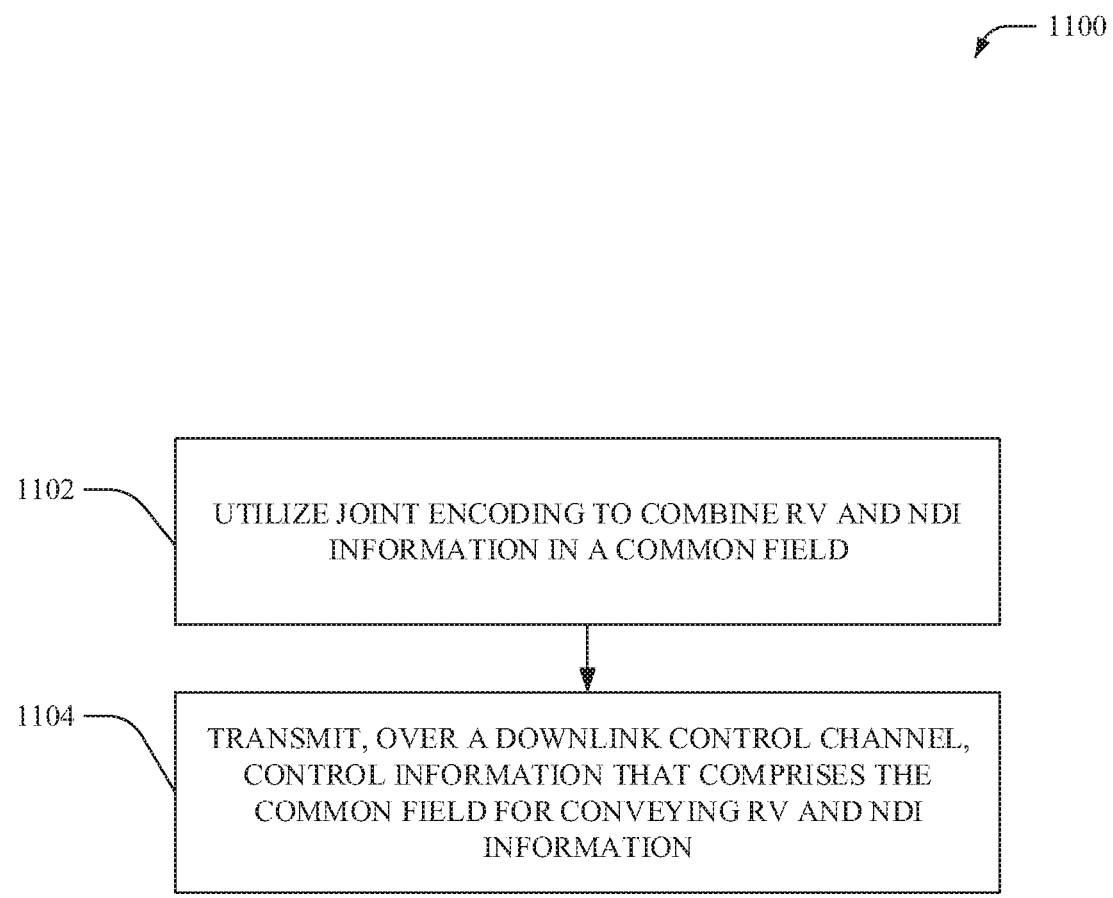
FIG. 11 illustrates an example method for indicating RV using joint encoding of RV and NDI within a data structure.

FIG. 11 illustrates an example method 1100 for indicating RV using joint encoding of RV and NDI within a data structure, according to an aspect of the subject disclosure. As an example, method 1100 can be implemented by one or more network devices (e.g., network device 102) of a communication network (e.g., cellular network). At 1102, joint encoding can be utilized to combine RV and NDI information within a common field (e.g., as shown in Table 2). Moreover, the number of bits utilized by the common field are less than that utilized if the RV and NDI information were to be indicated in separate fields. At 1104, control information (e.g., for a data transmission and/or a data retransmission) is transmitted over a downlink control channel, wherein the control information comprises the common field for conveying the RV and NDI information.

In one aspect, the systems 100-200 and methods 800-1100 disclosed herein provide various non-limiting advantages, for example, (i) reduced signaling overhead for downlink control channel, there by efficiently allocating the resources for control channel; (ii) reducing power utilized for transmitting downlink control channel; (iii) increasing power utilized for data transmission; (iv) reducing FER; (v) improving coverage and/or capacity; (vi) improving the link and system throughput; etc.

Figure 12:
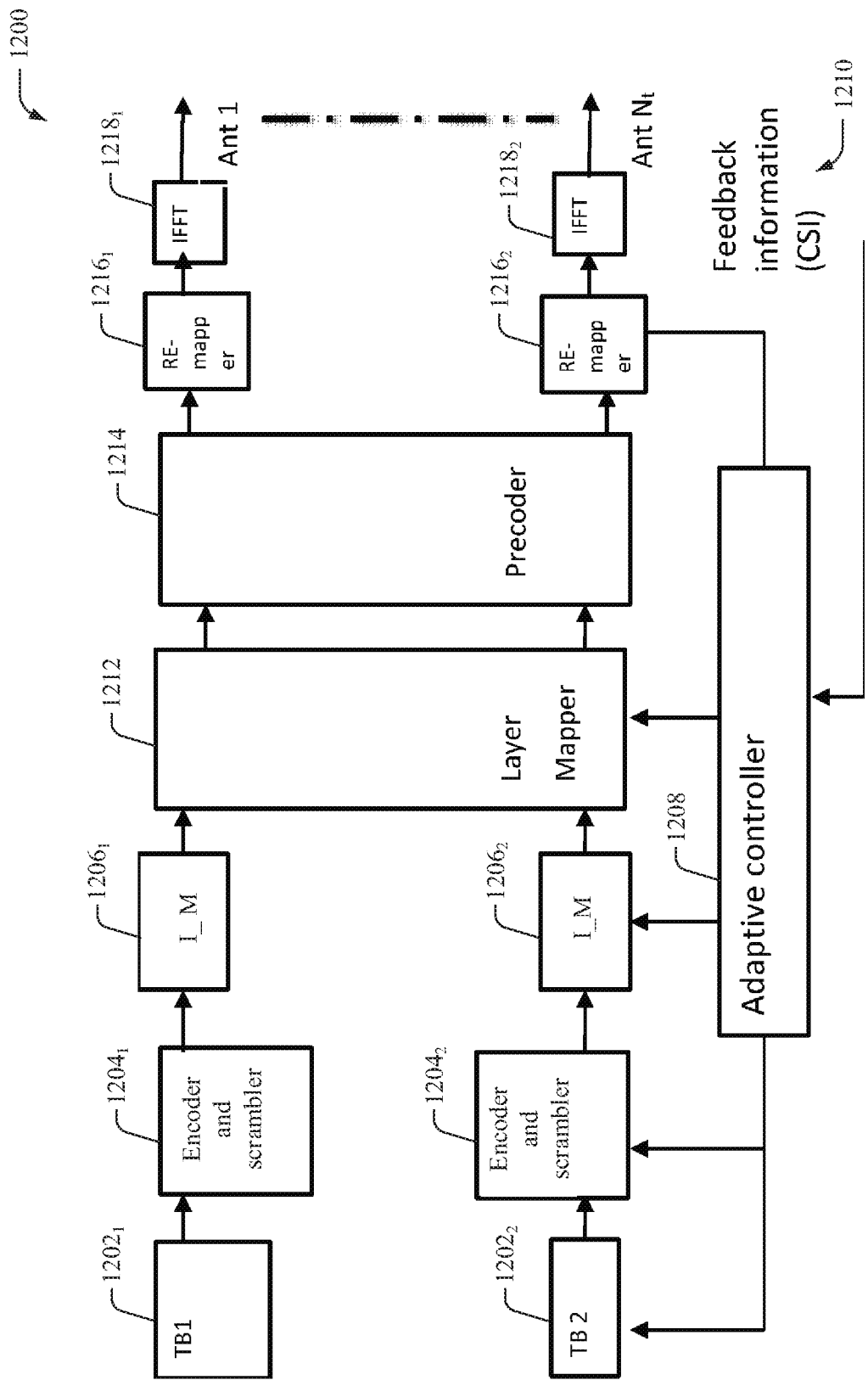
FIG. 12 illustrates an example system for coding a physical downlink shared channel (PDSCH), according to an aspect of the disclosure

FIG. 12 illustrates an example system 1200 for coding a PDSCH, according to an aspect of the disclosure. System 1200 depicts a transmission side of a MIMO communication system with Nt transmit antennas. As an example, two transport blocks ($1202_1$, $1202_2$) are depicted. It is noted that the number of transport blocks is equal to one when the number of layers is less than or equal to 4. If the number of layers is more than 4, then 2 transport blocks are transmitted. The CRC bits are added to each transport block and passed to the channel encoder ($1204_1$, $1204_2$). As an example, most any systematic code, such as but not limited to LDPC can be utilized as the FEC. The channel encoder ($1204_1$, $1204_2$) adds parity bits to protect the data. After encoding the data stream is scrambled with user specific scrambling. Then the stream is passed through an interleaver and modulator ($1206_1$, $1206_2$). The interleaver size is adaptively controlled (by adaptive controller 1208) by puncturing to increase the data rate. The adaptation is done by using the information from the feedback channel, for example CSI 1210 sent by the receiver (e.g., UE104). The interleaved data is passed through a symbol mapper (modulator). The symbol mapper is also controlled by the adaptive controller 1208. After the modulation, the streams are passed through a layer mapper 1212 and a precoder 1214. The resultant symbols are mapped to the resources elements in the time-frequency grid of orthogonal frequency-division multiplexing (OFDM), for example, by the RE-mappers ($1216_1$, $1216_2$). The resultant streams are then optionally passed through inverse fast Fourier transform (IFFT) blocks ($1218_1$, $1218_2$). It is noted that IFFT block are utilized for some communication systems that implement OFDMA as the access technology (e.g., 5G, LTE/LTE-A). The encoded stream is then transmitted through the respective antenna. Although system 1200 has been described with respect to a NR network, it is noted that the subject disclosure is not limited to NR networks and can be utilized in most any communication network.

Figure 13:
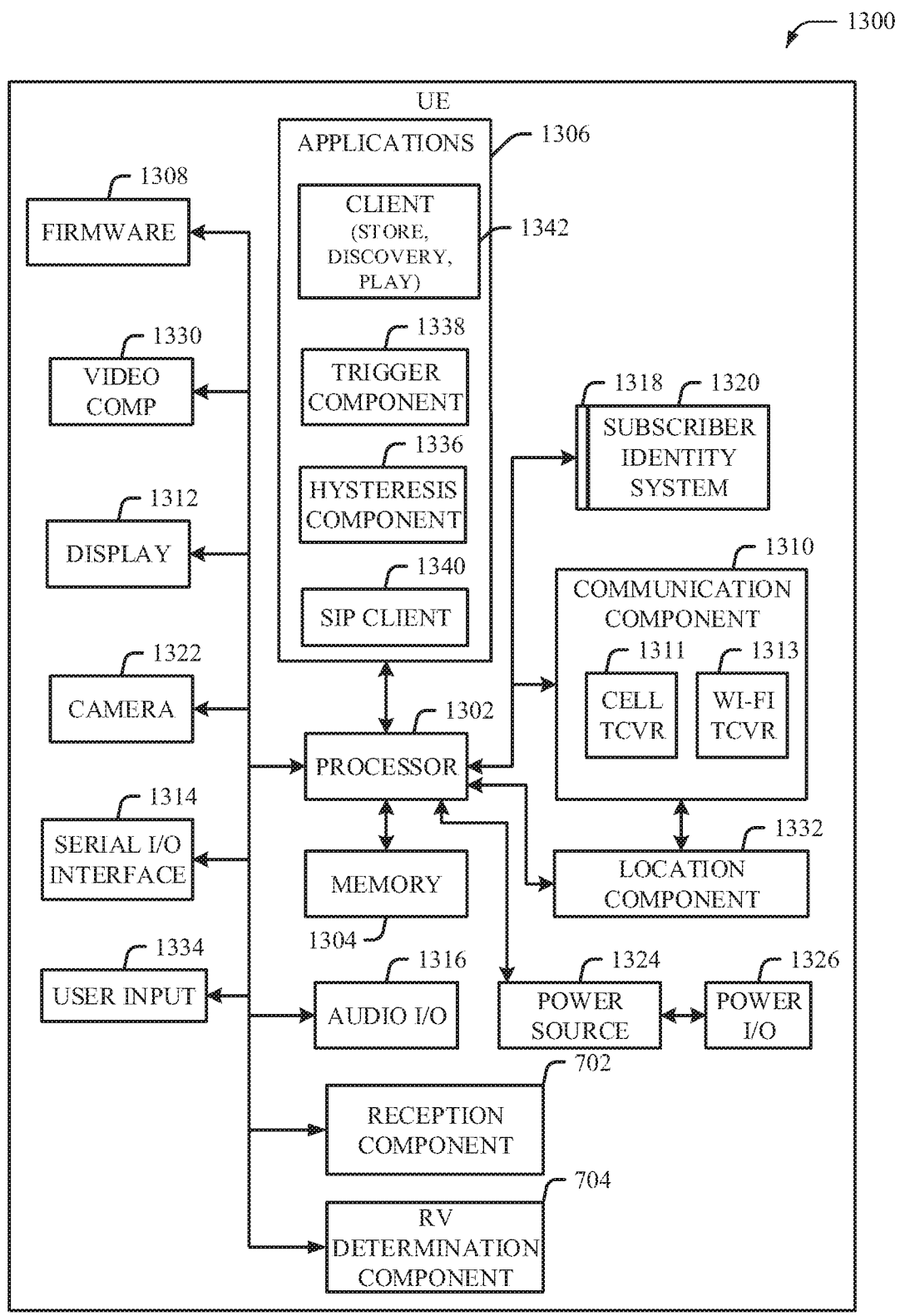
FIG. 13 illustrates an example block diagram of a user equipment operable to engage in a system architecture that facilitates wireless communications according to one or more embodiments described herein.

Referring now to FIG. 13, illustrated is an example block diagram of an example UE 1300 operable to engage in a system architecture that facilitates wireless communications according to one or more embodiments described herein. UE 104 described herein is substantially similar to UE 1300 and can comprise functionality as more fully, for example, as described herein with regard to UE 1300.

The following discussion is intended to provide a brief, general description of an example of a suitable environment in which the various embodiments can be implemented. While the description includes a general context of computer-executable instructions embodied on a machine-readable storage medium, those skilled in the art will recognize that the innovation also can be implemented in combination with other program modules and/or as a combination of hardware and software.

The UE includes a processor 1302 for controlling and processing all onboard operations and functions. A memory 1304 interfaces to the processor 1302 for storage of data and one or more applications 1306 (e.g., a video player software, user feedback component software, etc.). Other applications can include voice recognition of predetermined voice commands that facilitate initiation of the user feedback signals. The applications 1306 can be stored in the memory 1304 and/or in a firmware 1308, and executed by the processor 1302 from either or both the memory 1304 or/and the firmware 1308. The firmware 1308 can also store startup code for execution in initializing the UE 1300. A communications component 1310 interfaces to the processor 1302 to facilitate wired/wireless communication with external systems, e.g., cellular networks, VoIP networks, and so on. Here, the communications component 1310 can also include a suitable cellular transceiver 1311 (e.g., a GSM transceiver) and/or an unlicensed transceiver 1313 (e.g., Wi-Fi, WiMax) for corresponding signal communications. The UE 1300 can be a device such as a cellular telephone, a PDA with mobile communications capabilities, and messaging-centric devices. The communications component 1310 also facilitates communications reception from terrestrial radio networks (e.g., broadcast), digital satellite radio networks, and Internet-based radio services networks.

The UE 1300 includes a display 1312 for displaying text, images, video, telephony functions (e.g., a Caller ID function), setup functions, and for user input. For example, the display 1312 can also be referred to as a "screen" that can accommodate the presentation of multimedia content (e.g., music metadata, messages, wallpaper, graphics, etc.). The display 1312 can also display videos and can facilitate the generation, editing and sharing of video quotes. A serial I/O interface 1314 is provided in communication with the processor 1302 to facilitate wired and/or wireless serial communications (e.g., USB, and/or IEEE 1394) through a hardwire connection, and other serial input devices (e.g., a keyboard, keypad, and mouse). This supports updating and troubleshooting the UE 1300, for example. Audio capabilities are provided with an audio I/O component 1316, which can include a speaker for the output of audio signals related to, for example, indication that the user pressed the proper key or key combination to initiate the user feedback signal. The audio I/O component 1316 also facilitates the input of audio signals through a microphone to record data and/or telephony voice data, and for inputting voice signals for telephone conversations.

The UE 1300 can include a slot interface 1318 for accommodating a SIC (Subscriber Identity Component) in the form factor of a card Subscriber Identity Module (SIM) or universal SIM 1320, and interfacing the SIM card 1320 with the processor 1302. However, it is to be appreciated that the SIM card 1320 can be manufactured into the UE 1300, and updated by downloading data and software.

The UE 1300 can process IP data traffic through the communications component 1310 to accommodate IP traffic from an IP network such as, for example, the Internet, a corporate intranet, a home network, a person area network, etc., through an ISP or broadband cable provider. Thus, VoIP traffic can be utilized by the UE 1300 and IP-based multimedia content can be received in either an encoded or a decoded format.

A video processing component 1322 (e.g., a camera) can be provided for decoding encoded multimedia content. The video processing component 1322 can aid in facilitating the generation, editing, and sharing of video quotes. The UE 1300 also includes a power source 1324 in the form of batteries and/or an AC power subsystem, which power source 1324 can interface to an external power system or charging equipment (not shown) by a power I/O component 1326.

The UE 1300 can also comprise a video component 1330 for processing video content received and, for recording and transmitting video content. For example, the video component 1330 can facilitate the generation, editing and sharing of video quotes. A location-tracking component 1332 facilitates geographically locating the UE 1300. As described hereinabove, this can occur when the user initiates the feedback signal automatically or manually. A user input component 1334 facilitates the user initiating the quality feedback signal. The user input component 1334 can also facilitate the generation, editing and sharing of video quotes. The user input component 1334 can include such conventional input device technologies such as a keypad, keyboard, mouse, stylus pen, and/or touch screen, for example.

Referring again to the applications 1306, a hysteresis component 1336 facilitates the analysis and processing of hysteresis data, which is utilized to determine when to associate with the access point. A software trigger component 1338 can be provided that facilitates triggering of the hysteresis component 1336 when the Wi-Fi transceiver 1313 detects the beacon of the access point. A SIP client 1340 enables the UE 1300 to support SIP protocols and register the subscriber with the SIP registrar server. The applications 1306 can also include a client 1342 that provides at least the capability of discovery, play and store of multimedia content, for example, music.

The UE 1300, as indicated above related to the communications component 1310, includes an indoor network radio transceiver 1313 (e.g., Wi-Fi transceiver). This function supports the indoor radio link, such as IEEE 802.11, for the dual-mode GSM UE 1300. The UE 1300 can accommodate at least satellite radio services through a UE that can combine wireless voice and digital radio chipsets into a single handheld device. Further, UE 1300 can comprise the reception component 702 and the RV determination component 704, which can comprise functionality as more fully described herein, for example, as described above with regard to system 700.

Figure 14:
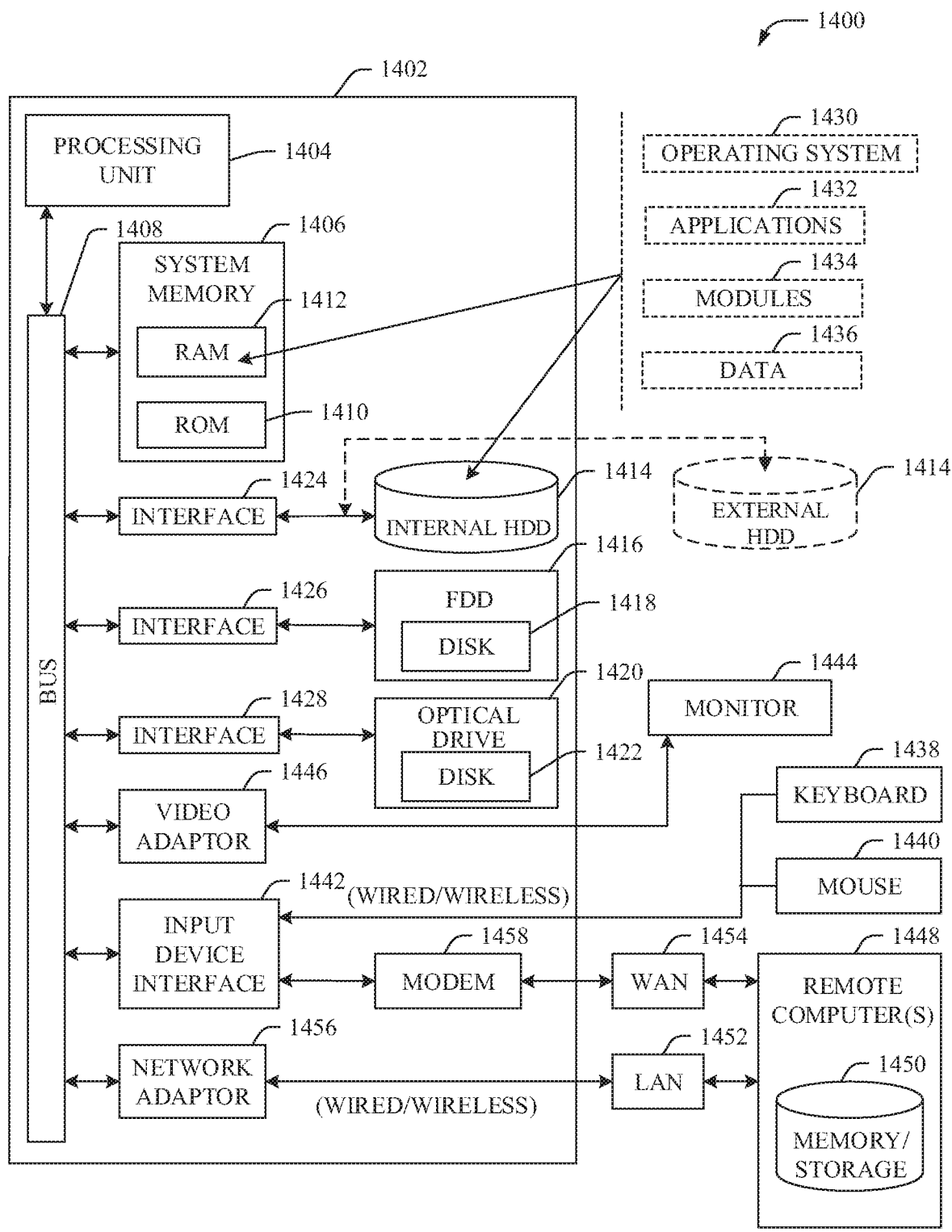
FIG. 14 illustrates a block diagram of a computer operable to execute the disclosed communication architecture.

Referring now to FIG. 14, there is illustrated a block diagram of a computer 1402 operable to execute the disclosed communication architecture. In order to provide additional context for various aspects of the disclosed subject matter, FIG. 14 and the following discussion are intended to provide a brief, general description of a suitable computing environment 1400 in which the various aspects of the specification can be implemented. While the specification has been described above in the general context of computer-executable instructions that can run on one or more computers, those skilled in the art will recognize that the specification also can be implemented in combination with other program modules and/or as a combination of hardware and software.

Generally, applications (e.g., program modules) comprise routines, programs, components, data structures, etc., that perform particular tasks or implement particular abstract data types. Moreover, those skilled in the art will note that the inventive methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the specification can also be practiced in distributed computing environments where certain tasks are performed by remote processing devices that are linked through a communications network. In a distributed computing environment, program modules can be located in both local and remote memory storage devices.

A computing device can typically include a variety of machine-readable media. Machine-readable media can be any available media that can be accessed by the computer and includes both volatile and non-volatile media, removable and non-removable media. By way of example and not limitation, computer-readable media can comprise computer storage media and communication media. Computer storage media can include volatile and/or non-volatile media, removable and/or non-removable media implemented in any method or technology for storage of information, such as computer-readable instructions, data structures, program modules, or other data. Computer storage media can include, but is not limited to, RAM, ROM, EEPROM, flash memory or other memory technology, solid state drive (SSD) or other solid-state storage technology, Compact Disk Read Only Memory (CD ROM), digital video disk (DVD), Blu-ray disk, or other optical disk storage, magnetic cassettes, magnetic tape, magnetic disk storage or other magnetic storage devices, or any other medium which can be used to store the desired information and which can be accessed by the computer. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, radio frequency (RF), infrared and other wireless media. Combinations of the any of the above should also be included within the scope of computer-readable media.

With reference again to FIG. 14, the example environment 1400 for implementing various aspects of the specification comprises a computer 1402, the computer 1402 comprising a processing unit 1404, a system memory 1406 and a system bus 1408. As an example, the component(s), application(s) server(s), equipment, system(s), interface(s), gateway(s), controller(s), node(s), entity(ies), function(s), cloud(s) and/or device(s) (e.g., network device 102, UE 104, rate matching component 202, DCI structure determination component 204, transmission component 206, reception component 702, RV determination component 704, UE 1300, etc.) disclosed herein with respect to systems 100, 200, 700, 1200, and 1300 can each comprise at least a portion of the computer 1402. The system bus 1408 couples system components comprising, but not limited to, the system memory 1406 to the processing unit 1404. The processing unit 1404 can be any of various commercially available processors. Dual microprocessors and other multi-processor architectures can also be employed as the processing unit 1404.

The system bus 1408 can be any of several types of bus structure that can further interconnect to a memory bus (with or without a memory controller), a peripheral bus, and a local bus using any of a variety of commercially available bus architectures. The system memory 1406 comprises read-only memory (ROM) 1410 and random access memory (RAM) 1412. A basic input/output system (BIOS) is stored in a non-volatile memory 1410 such as ROM, EPROM, EEPROM, which BIOS contains the basic routines that help to transfer information between elements within the computer 1402, such as during startup. The RAM 1412 can also comprise a high-speed RAM such as static RAM for caching data.

The computer 1402 further comprises an internal hard disk drive (HDD) 1414, which internal hard disk drive 1414 can also be configured for external use in a suitable chassis (not shown), a magnetic floppy disk drive (FDD) 1416, (e.g., to read from or write to a removable diskette 1418) and an optical disk drive 1420, (e.g., reading a CD-ROM disk 1422 or, to read from or write to other high capacity optical media such as the DVD). The hard disk drive 1414, magnetic disk drive 1416 and optical disk drive 1420 can be connected to the system bus 1408 by a hard disk drive interface 1424, a magnetic disk drive interface 1426 and an optical drive interface 1428, respectively. The interface 1424 for external drive implementations comprises at least one or both of Universal Serial Bus (USB) and IEEE 1394 interface technologies. Other external drive connection technologies are within contemplation of the subject disclosure.

The drives and their associated computer-readable storage media provide nonvolatile storage of data, data structures, computer-executable instructions, and so forth. For the computer 1402, the drives and storage media accommodate the storage of any data in a suitable digital format. Although the description of computer-readable storage media above refers to a HDD, a removable magnetic diskette, and a removable optical media such as a CD or DVD, it should be noted by those skilled in the art that other types of storage media which are readable by a computer, such as zip drives, magnetic cassettes, flash memory cards, solid-state disks (SSD), cartridges, and the like, can also be used in the example operating environment, and further, that any such storage media can contain computer-executable instructions for performing the methods of the specification.

A number of program modules can be stored in the drives and RAM 1412, comprising an operating system 1430, one or more application programs 1432, other program modules 1434 and program data 1436. All or portions of the operating system, applications, modules, and/or data can also be cached in the RAM 1412. It is noted that the specification can be implemented with various commercially available operating systems or combinations of operating systems.

A user can enter commands and information into the computer 1402 through one or more wired/wireless input devices, e.g., a keyboard 1438 and/or a pointing device, such as a mouse 1440 or a touchscreen or touchpad (not illustrated). These and other input devices are often connected to the processing unit 1404 through an input device interface 1442 that is coupled to the system bus 1408, but can be connected by other interfaces, such as a parallel port, an IEEE 1394 serial port, a game port, a USB port, an IR interface, etc. A monitor 1444 or other type of display device is also connected to the system bus 1408 via an interface, such as a video adapter 1446.

The computer 1402 can operate in a networked environment using logical connections via wired and/or wireless communications to one or more remote computers, such as a remote computer(s) 1448. The remote computer(s) 1448 can be a workstation, a server computer, a router, a personal computer, portable computer, microprocessor-based entertainment appliance, a peer device or other common network node, and typically comprises many or all of the elements described relative to the computer 1402, although, for purposes of brevity, only a memory/storage device 1450 is illustrated. The logical connections depicted comprise wired/wireless connectivity to a local area network (LAN) 1452 and/or larger networks, e.g., a wide area network (WAN) 1454. Such LAN and WAN networking environments are commonplace in offices and companies, and facilitate enterprise-wide computer networks, such as intranets, all of which can connect to a global communications network, e.g., the Internet.

When used in a LAN networking environment, the computer 1402 is connected to the local network 1452 through a wired and/or wireless communication network interface or adapter 1456. The adapter 1456 can facilitate wired or wireless communication to the LAN 1452, which can also comprise a wireless access point disposed thereon for communicating with the wireless adapter 1456.

When used in a WAN networking environment, the computer 1402 can comprise a modem 1458, or is connected to a communications server on the WAN 1454, or has other means for establishing communications over the WAN 1454, such as by way of the Internet. The modem 1458, which can be internal or external and a wired or wireless device, is connected to the system bus 1408 via the serial port interface 1442. In a networked environment, program modules depicted relative to the computer 1402, or portions thereof, can be stored in the remote memory/storage device 1450. It will be noted that the network connections shown are example and other means of establishing a communications link between the computers can be used.

The computer 1402 is operable to communicate with any wireless devices or entities operatively disposed in wireless communication, e.g., desktop and/or portable computer, server, communications satellite, etc. This comprises at least Wi-Fi and Bluetooth™ wireless technologies or other communication technologies. Thus, the communication can be a predefined structure as with a conventional network or simply an ad hoc communication between at least two devices.

Wi-Fi, or Wireless Fidelity networks use radio technologies called IEEE 802.11 (a, b, g, n, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

In the subject specification, terms such as "data store," data storage," "database," "cache," and substantially any other information storage component relevant to operation and functionality of a component, refer to "memory components," or entities embodied in a "memory" or components comprising the memory. It will be noted that the memory components, or computer-readable storage media, described herein can be either volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Figure 15:
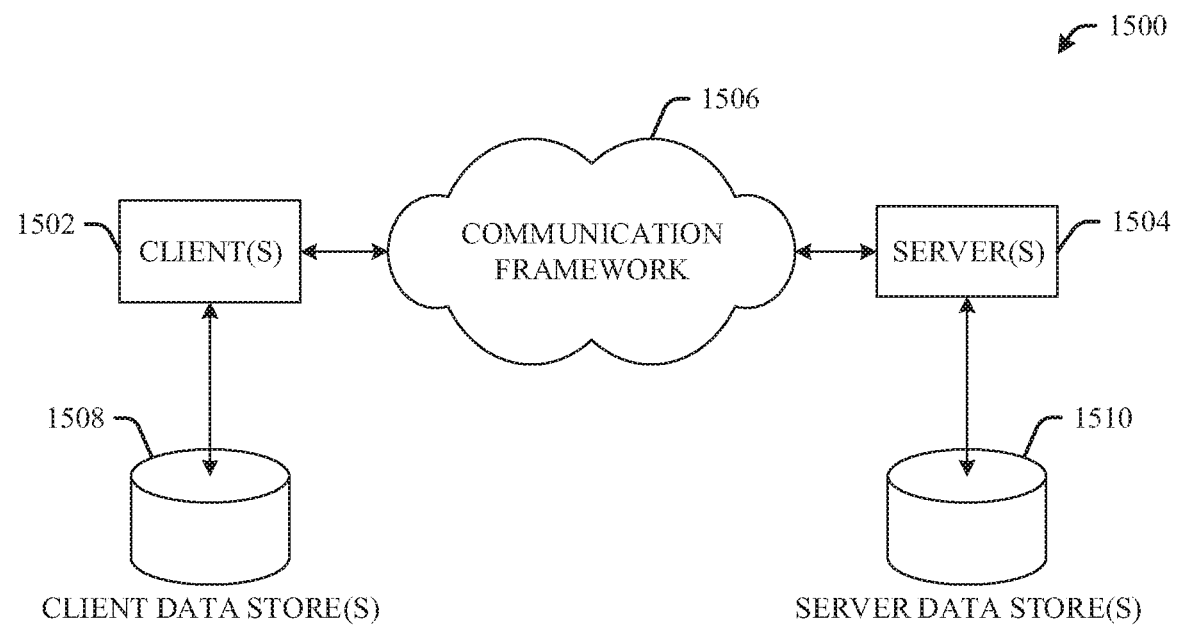
FIG. 15 illustrates a schematic block diagram of a computing environment in accordance with the subject specification

Referring now to FIG. 15, there is illustrated a schematic block diagram of a computing environment 1500 in accordance with the subject specification. The system 1500 comprises one or more client(s) 1502. The client(s) 1502 can be hardware and/or software (e.g., threads, processes, computing devices).

The system 1500 also comprises one or more server(s) 1504. The server(s) 1504 can also be hardware and/or software (e.g., threads, processes, computing devices). The servers 1504 can house threads to perform transformations by employing the specification, for example. One possible communication between a client 1502 and a server 1504 can be in the form of a data packet adapted to be transmitted between two or more computer processes. The data packet may comprise a cookie and/or associated contextual information, for example. The system 1500 comprises a communication framework 1506 (e.g., a global communication network such as the Internet, cellular network, etc.) that can be employed to facilitate communications between the client(s) 1502 and the server(s) 1504.

Communications can be facilitated via a wired (comprising optical fiber) and/or wireless technology. The client(s) 1502 are operatively connected to one or more client data store(s) 1508 that can be employed to store information local to the client(s) 1502 (e.g., cookie(s) and/or associated contextual information). Similarly, the server(s) 1504 are operatively connected to one or more server data store(s) 1510 that can be employed to store information local to the servers 1504.

What has been described above comprises examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "comprises" is used in either the detailed description or the claims, such term is intended to be inclusive in a manner similar to the term "comprising" as "comprising" is interpreted when employed as a transitional word in a claim.

What is claimed is:

1. A system, comprising:
   a processor; and
   a memory that stores executable instructions that, when executed by the processor, facilitate performance of operations, comprising:
   determining a data structure for control information associated with a transmission of data from a transmitter device to a receiver device, wherein the first data structure comprises a two-bit field that jointly indicates a redundancy version and a new data indicator for the transmission, and:
   a first value of the two-bit field indicates a first redundancy version and that a first in time transmission of the data is scheduled for the transmission, and a second value of the two-bit field indicates a second redundancy version and that a retransmission of the data is scheduled for the transmission.

2. The system of claim 1, wherein the second value of the two-bit field further indicates that the second redundancy version equals redundancy version one.

3. The system of claim 1, wherein the first value of the two-bit field further indicates that the first redundancy version equals redundancy version zero.

4. The system of claim 1, wherein the data structure further comprises a bit that indicates that the transmission is a chase-combining hybrid automatic repeat request.

5. The system of claim 1, wherein the data structure further comprises a bit that indicates that the retransmission is an incremental redundancy hybrid automatic repeat request.

6. The system of claim 1, wherein the second value of the two-bit field further indicates that the second redundancy version equals redundancy version two or that second redundancy version equals redundancy version three.

7. The system of claim 1, wherein the operations further comprise:
directing, from the transmitter device to the receiver device, the control information that adheres to the data structure.

8. The system of claim 1, wherein the transmitter device is an access point device of a communication network, and wherein the receiver device is a user equipment coupled to the access point device.

9. The system of claim 1, wherein the receiver device is an access point device of a communication network, and wherein the transmitter device is a user equipment coupled to the access point device.

10. A method, comprising:
determining, by a system comprising a processor, an adaptable data structure for control information associated with a transmission of data from a transmitter device to a receiver device, wherein the first data structure comprises a two-bit field that jointly indicates a redundancy version and a new data indicator for the transmission, and:
a first value of the two-bit field indicates a first redundancy version and that a first in time transmission of the data is scheduled for the transmission, and
a second value of the two-bit field indicates a second redundancy version and that a retransmission of the data is scheduled for the transmission; and
directing, by the system, the control information from the transmitter device to the receiver device, wherein the control information conforms to the adaptable data structure.

11. The method of claim 10, wherein the second value of the two-bit field further indicates that the second redundancy version equals redundancy version one.

12. The method of claim 10, wherein the first value of the two-bit field further indicates that the first redundancy version equals redundancy version zero.

13. The method of claim 10, wherein the data structure further comprises a bit that indicates that the transmission is a chase-combining hybrid automatic repeat request.

14. The method of claim 10, wherein the data structure further comprises a bit that indicates that the retransmission is an incremental redundancy hybrid automatic repeat request.

15. The method of claim 10, wherein the second value of the two-bit field further indicates that the second redundancy version equals redundancy version two.

16. The method of claim 10, wherein the second value of the two-bit field further indicates that the second redundancy version equals redundancy version three.

17. A non-transitory machine-readable medium, comprising executable instructions that, when executed by a processor, facilitate performance of operations, comprising:
determining a data structure for control information associated with a transmission of data from a transmitter device to a receiver device, wherein the first data structure comprises a two-bit field that jointly indicates a redundancy version and a new data indicator for the transmission, and:
a first value of the two-bit field indicates a first redundancy version and that a first in time transmission of the data is scheduled for the transmission, and
a second value of the two-bit field indicates a second redundancy version and that a retransmission of the data is scheduled for the transmission.

18. The non-transitory machine-readable medium of claim 17, wherein the redundancy version defines a starting point for extracting bits from a systematic bit stream associated with a transport block.

19. The non-transitory machine-readable medium of claim 18, wherein the transport block is encoded based on a systematic code.

20. The non-transitory machine-readable medium of claim 17, wherein the redundancy version is determined based on a circular buffer utilized for rate matching.

* * * * *